(12) United States Patent
Baloglu et al.

(10) Patent No.: US 11,031,259 B2
(45) Date of Patent: *Jun. 8, 2021

(54) METHOD OF MANUFACTURING AN ELECTRONIC DEVICE AND ELECTRONIC DEVICE MANUFACTURED THEREBY

(71) Applicant: Amkor Technology Singapore Holding Pte. Ltd., Valley Point (SG)

(72) Inventors: Bora Baloglu, Chandler, AZ (US); Curtis Zwenger, Chandler, AZ (US); Ronald Huemoeller, Gilbert, AZ (US)

(73) Assignee: Amkor Technology Singapore Holding Pte. Ltd., Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 16/673,044

(22) Filed: Nov. 4, 2019

(65) Prior Publication Data

US 2020/0251354 A1 Aug. 6, 2020

Related U.S. Application Data

(63) Continuation of application No. 15/905,602, filed on Feb. 26, 2018, now Pat. No. 10,468,272, which is a
(Continued)

(51) Int. Cl.
*H01L 21/56* (2006.01)
*H01L 23/00* (2006.01)
(Continued)

(52) U.S. Cl.
CPC .......... *H01L 21/568* (2013.01); *H01L 21/561* (2013.01); *H01L 21/565* (2013.01); *H01L 21/6835* (2013.01); *H01L 24/19* (2013.01); *H01L 24/20* (2013.01); *H01L 24/81* (2013.01); *H01L 24/83* (2013.01); *H01L 24/92* (2013.01); *H01L 24/96* (2013.01); *H01L 24/97* (2013.01); *H01L 23/3128* (2013.01); *H01L 23/49816* (2013.01); *H01L 23/49822* (2013.01); *H01L 24/13* (2013.01); *H01L 24/16* (2013.01); *H01L 2221/68359* (2013.01); *H01L 2221/68377* (2013.01); *H01L 2224/12105* (2013.01); *H01L 2224/131* (2013.01); *H01L 2224/1319* (2013.01); *H01L 2224/13147* (2013.01); *H01L 2224/16227* (2013.01); *H01L 2224/81002* (2013.01); *H01L 2224/81005* (2013.01); *H01L 2224/81203* (2013.01);
(Continued)

(58) Field of Classification Search
None
See application file for complete search history.

(56) References Cited

U.S. PATENT DOCUMENTS 9,905,440 B1 * 2/2018 Baloglu .................. H01L 24/96
10,468,272 B2 * 11/2019 Baloglu .................. H01L 24/96
(Continued)

*Primary Examiner* — Asok K Sarkar
(74) *Attorney, Agent, or Firm* — McAndrews, Held & Malloy, Ltd.

(57) ABSTRACT

An electronic device and a method of making an electronic device. As non-limiting examples, various aspects of this disclosure provide methods of making an electronic device, and electronic devices made thereby, that comprise forming first and second encapsulating materials, followed by further processing and the removal of the entire second encapsulating material.

20 Claims, 8 Drawing Sheets

Related U.S. Application Data continuation of application No. 15/249,201, filed on Aug. 26, 2016, now Pat. No. 9,905,440.

(51) Int. Cl.
*H01L 21/683* (2006.01)
*H01L 23/31* (2006.01)
*H01L 23/498* (2006.01)

(52) U.S. Cl.
CPC ........... *H01L 2224/81815* (2013.01); *H01L 2224/83005* (2013.01); *H01L 2224/83102* (2013.01); *H01L 2224/9202* (2013.01); *H01L 2224/9211* (2013.01); *H01L 2224/92125* (2013.01); *H01L 2224/96* (2013.01); *H01L 2224/97* (2013.01); *H01L 2924/181* (2013.01); *H01L 2924/18161* (2013.01)

(56) References Cited

U.S. PATENT DOCUMENTS

| | | |
|---|---|---|
| 2014/0117537 A1 | 5/2014 | Lin |
| 2016/0276309 A1 | 9/2016 | Paek |
| 2017/0084596 A1 | 3/2017 | Scanlan |

* cited by examiner

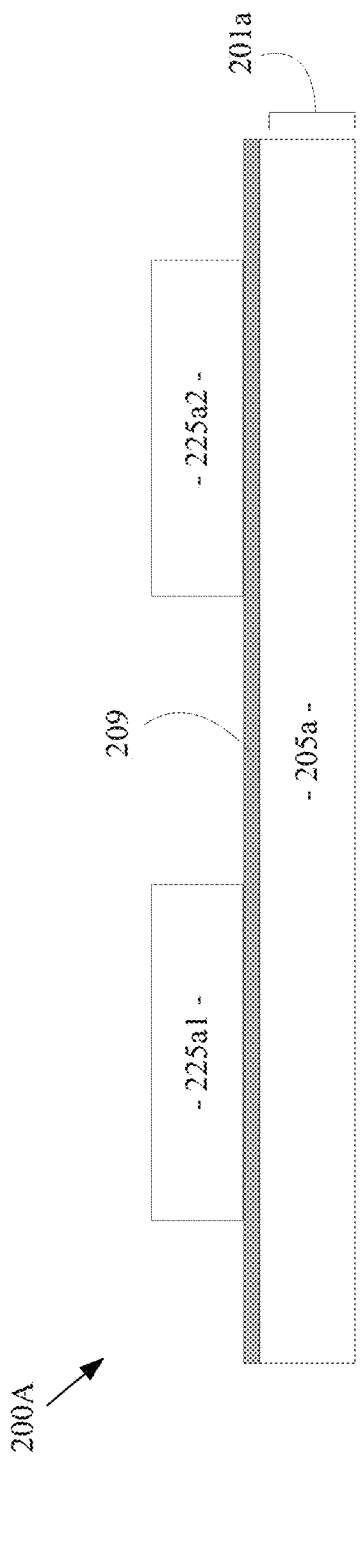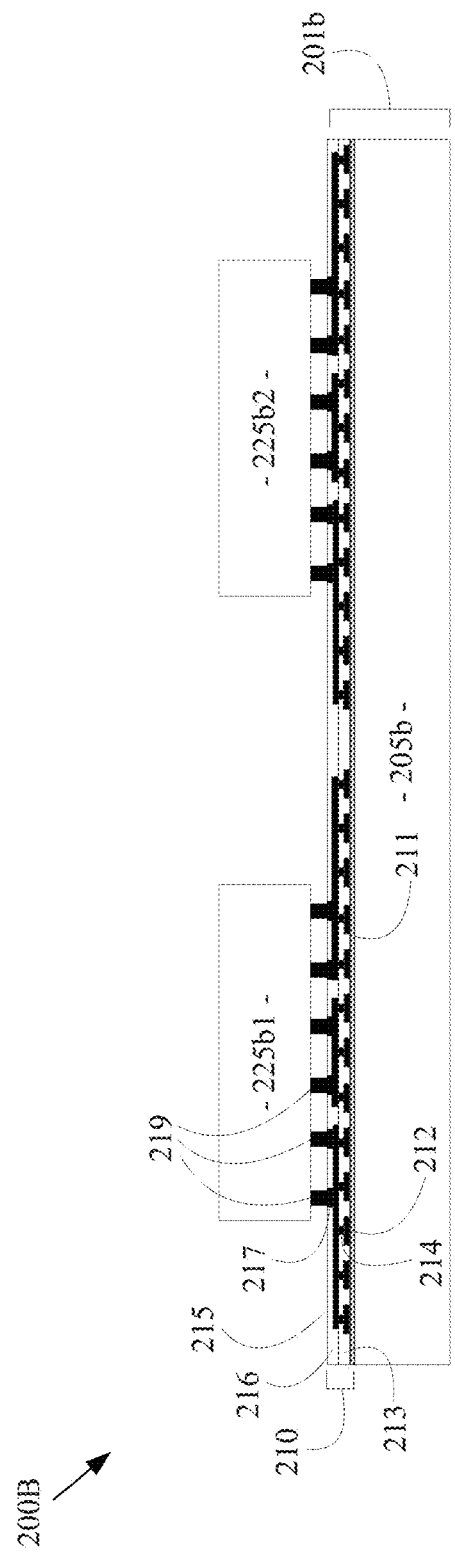
Figure 2A
Figure 2B

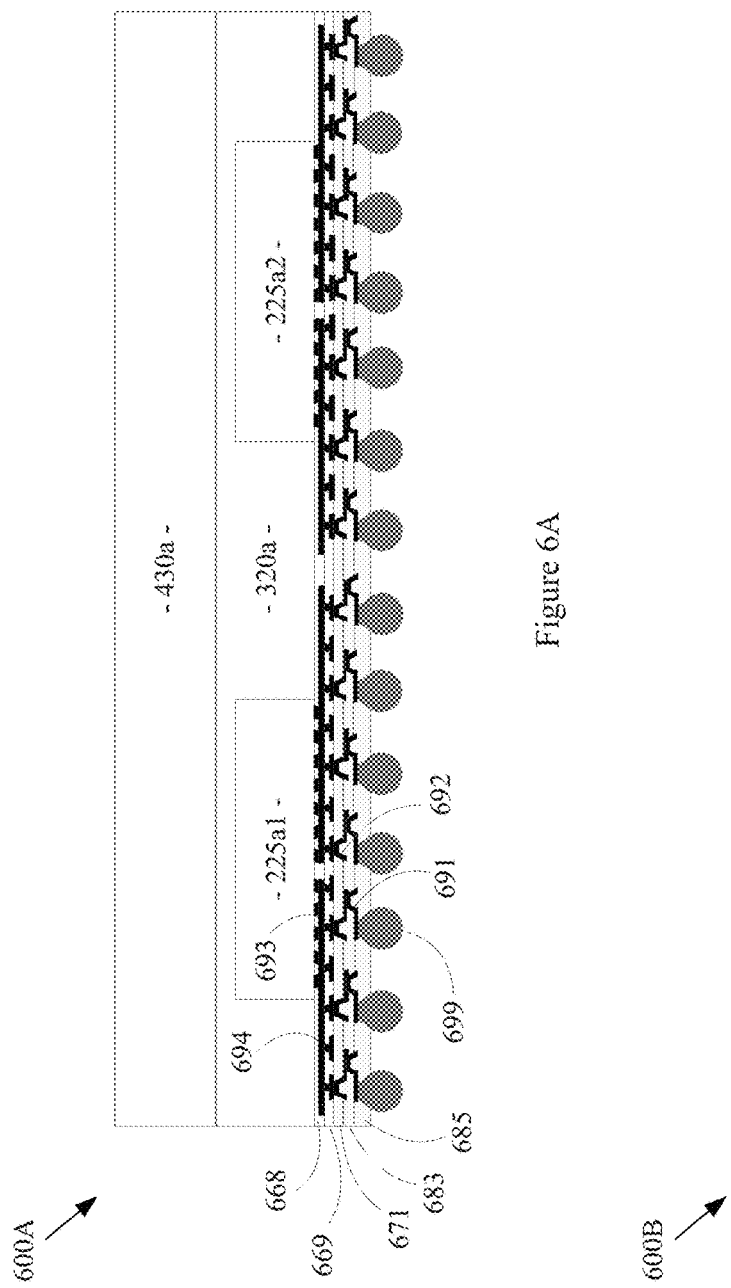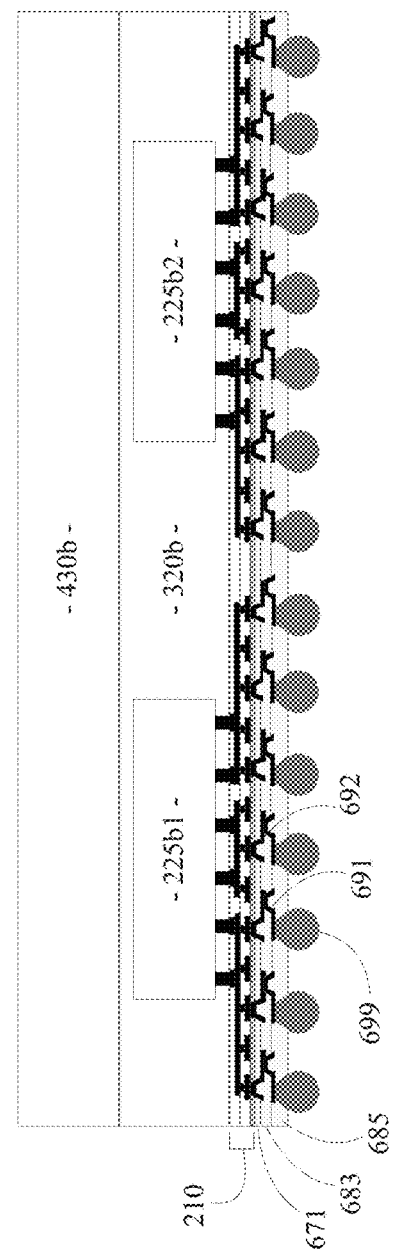

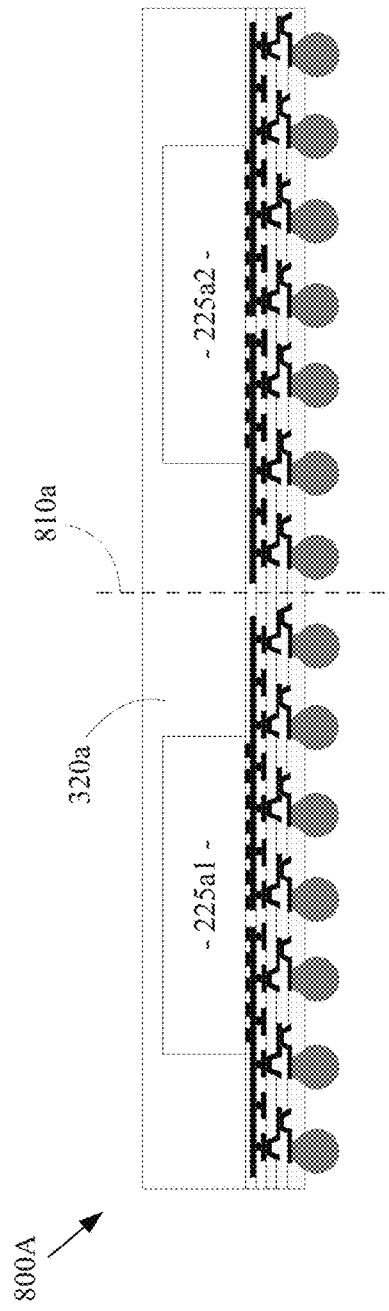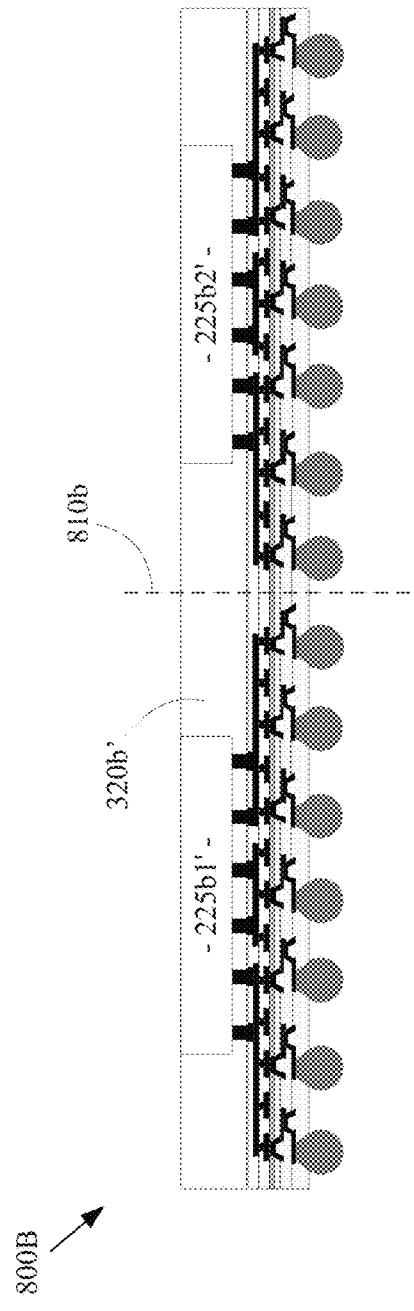
Figure 8A
Figure 8B

METHOD OF MANUFACTURING AN ELECTRONIC DEVICE AND ELECTRONIC DEVICE MANUFACTURED THEREBY

CROSS-REFERENCE TO RELATED APPLICATIONS/INCORPORATION BY REFERENCE

This application is a continuation of U.S. patent application Ser. No. 15/905,602, filed Feb. 26, 2018, and titled "Method of Manufacturing an Electronic Device and Electronic Device Manufactured Thereby," expected to issue as U.S. Pat. No. 10,468,272; which is a continuation of U.S. patent application Ser. No. 15/249,201, filed Aug. 26, 2016, and titled "Method of Manufacturing an Electronic Device and Electronic Device Manufactured Thereby," now U.S. Pat. No. 9,905,440; the entire contents of each is which is hereby incorporated herein by reference, in its entirety.

BACKGROUND

Present semiconductor packages and methods for forming semiconductor packages are inadequate, for example resulting in excess cost, decreased reliability, or package sizes that are too large. Further limitations and disadvantages of conventional and traditional approaches will become apparent to one of skill in the art, through comparison of such approaches with the present disclosure as set forth in the remainder of the present application with reference to the drawings.

BRIEF DESCRIPTION OF SEVERAL VIEWS OF THE DRAWINGS

FIGS. 2A and 2B shown cross-sectional views illustrating an example electronic device and an example method of making an electronic device, in accordance with various aspects of the present disclosure.

FIGS. 6A and 6B shown cross-sectional views illustrating an example electronic device and an example method of making an electronic device, in accordance with various aspects of the present disclosure.

FIGS. 8A and 8B shown cross-sectional views illustrating an example electronic device and an example method of making an electronic device, in accordance with various aspects of the present disclosure.

SUMMARY

Figure 1:
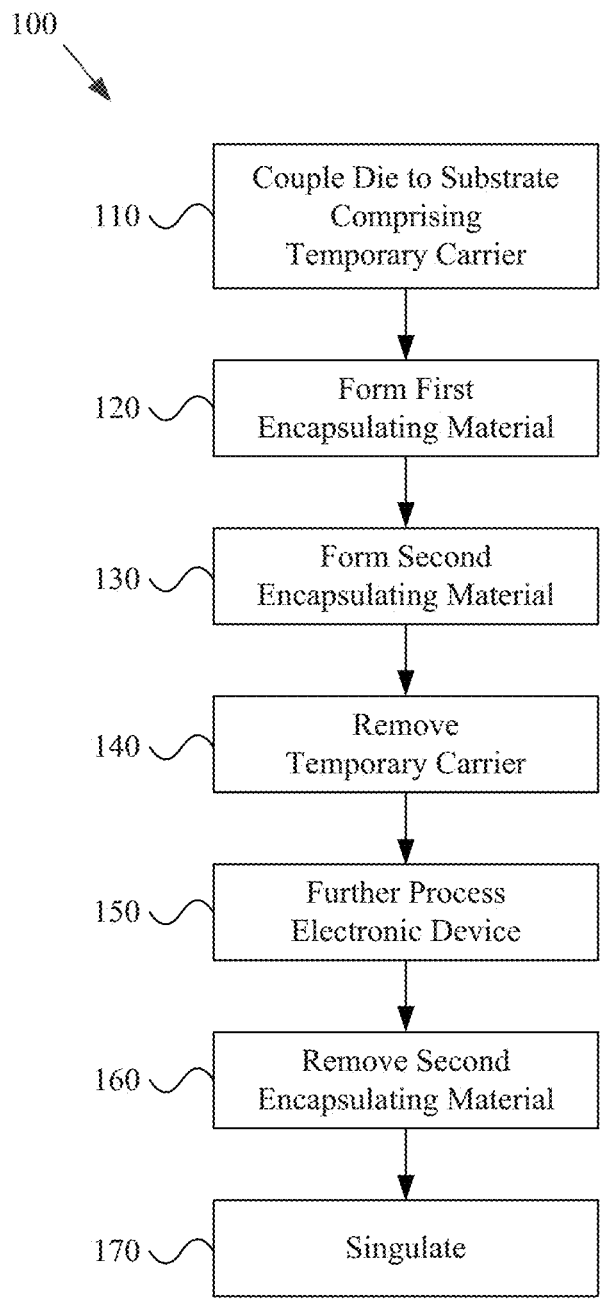
FIG. 1 shows a flow diagram of an example method of making an electronic device, in accordance with various aspects of the present disclosure.

Various aspects of this disclosure provide an electronic device and a method of making an electronic device. As non-limiting examples, various aspects of this disclosure provide methods of making an electronic device, and electronic devices made thereby, that comprise forming first and second encapsulating materials, followed by further processing and the removal of the entire second encapsulating material.

DETAILED DESCRIPTION OF VARIOUS ASPECTS OF THE DISCLOSURE

The following discussion presents various aspects of the present disclosure by providing examples thereof. Such examples are non-limiting, and thus the scope of various aspects of the present disclosure should not necessarily be limited by any particular characteristics of the provided examples. In the following discussion, the phrases "for example," "e.g.," and "exemplary" are non-limiting and are generally synonymous with "by way of example and not limitation," "for example and not limitation," and the like.

As utilized herein, "and/or" means any one or more of the items in the list joined by "and/or". As an example, "x and/or y" means any element of the three-element set {(x), (y), (x, y)}. In other words, "x and/or y" means "one or both of x and y." As another example, "x, y, and/or z" means any element of the seven-element set {(x), (y), (z), (x, y), (x, z), (y, z), (x, y, z)}. In other words, "x, y and/or z" means "one or more of x, y, and z."

The terminology used herein is for the purpose of describing particular examples only and is not intended to be limiting of the disclosure. As used herein, the singular forms are intended to include the plural forms as well, unless the context clearly indicates otherwise. It will be further understood that the terms "comprises," "includes," "comprising," "including," "has," "have," "having," and the like when used in this specification, specify the presence of stated features, integers, steps, operations, elements, and/or components, but do not preclude the presence or addition of one or more other features, integers, steps, operations, elements, components, and/or groups thereof.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present disclosure. Similarly, various spatial terms, such as "upper," "lower," "side," and the like, may be used in distinguishing one element from another element in a relative manner. It should be understood, however, that components may be oriented in different manners, for example a semiconductor device or package may be turned sideways so that its "top" surface is facing horizontally and its "side" surface is facing vertically, without departing from the teachings of the present disclosure.

Various aspects of the present disclosure provide a method of making an electronic device, and an electronic device made thereby, which can decrease the cost, increase the reliability, and/or increase the manufacturability of the semiconductor device or package.

The above and other aspects of the present disclosure will be described in or be apparent from the following description of various example implementations. Various aspects of the present disclosure will now be presented with reference to accompanying drawings, such that those skilled in the art may readily practice the various aspects.

FIG. 1 shows a flow diagram of an example method of making an electronic device, in accordance with various aspects of the present disclosure. FIGS. 2-8 may, for example, illustrate an example electronic device at various blocks (or stages or steps) of the method 100 of FIG. 1. FIGS. 1 and 2-8 will now be discussed together. It should be noted that the order of the example blocks of the method 100 (or portions thereof) may vary without departing from the scope of this disclosure.

The method 100 may begin executing in response to any of a variety of causes or conditions, non-limiting examples of which are provided herein. For example, the method 100 may begin executing automatically in response to one or more signals received from one or more upstream and/or downstream manufacturing stations, in response to a signal from a central manufacturing line controller, etc. Also for example, the method 100 may begin executing in response to an operator command to begin. Additionally for example, the method 100 may begin executing in response to receiving execution flow from any other method block (or stage or step) discussed herein. Further for example, the method 100 may begin executing in response to the arrival of a die (or other electronic component) and/or substrate at a manufacturing station performing a portion or all of block 110.

The example method 100 may, at block 110, comprise coupling one or more semiconductor die to a substrate. Block 110 may comprise performing such coupling in any of a variety of manners, non-limiting examples of which are provided herein.

For example, block 110 may comprise adhering the one or more semiconductor die to the substrate utilizing a layer of adhesive (e.g., a liquid or paste layer, an adhesive tape, a printed liquid adhesive, a preformed adhesive film applied to the substrate and/or die, die attach sheet, etc.). Such adhering may, for example, be temporary. For example, a thermally releasable adhesive, a light-releasable adhesive, etc., may be utilized, which may then be later released (e.g., at block 140). Also for example, block 110 may comprise permanently attaching the one or more semiconductor die to the substrate (e.g., utilizing solder attachment, direct metal-to-metal bonding, conductive epoxy, etc.).

The substrate may, for example, comprise a temporary carrier. For example, the substrate may comprise only a temporary carrier. The temporary carrier may, for example, comprise any of a variety of materials (e.g., glass, metal, silicon or other semiconductor material, polymer, etc.). Non-limiting examples of such substrates and/or temporary carriers and/or die attachment thereto may, for example, be found in U.S. patent application Ser. No. 13/709,414, filed Dec. 10, 2012, titled "Method and System for Semiconductor Packaging", the entire content of which is hereby incorporated herein by reference for all purposes.

An example 200A of coupling die to such a substrate is shown at FIG. 2A, which shows a substrate 201a comprising only a temporary carrier 205a. The example 200A also shows a first semiconductor die 225a1 and a second semiconductor die 225a2 adhesively coupled to the substrate 201a (or temporary carrier 205a thereof) with an adhesive layer 209. Note that although the adhesive layer 209 is shown covering the entire substrate 201a, in another example implementation, the adhesive layer 209 may only be positioned directly between the die 225a1 and 225a2 and the substrate 201a.

Also for example, the substrate may comprise a temporary carrier and a permanent portion. The permanent portion may, for example, be a portion of the substrate that is to remain a permanent part of the completed electronic device. In an example implementation, the substrate may comprise a temporary carrier (e.g., silicon or other semiconductor material, glass, metal, polymer, etc.) coupled to a permanent interposer. The permanent interposer may, for example, be an interposer that is to remain a permanent part of the completed electronic device. The interposer may, for example, comprise one or more dielectric layers and/or conductive layers and distribute (or redistribute, for example laterally) electrical signals to and/or from the semiconductor die. Non-limiting examples of such substrates, temporary carriers, interposers and/or die attachment thereto may, for example, be found in U.S. patent application Ser. No. 15/207,186, filed Jul. 11, 2016, and titled "Semiconductor Package and Fabricating Method thereof"; and U.S. patent application Ser. No. 14/823,689, filed Aug. 11, 2015, and titled "Semiconductor Package and Fabricating Method Thereof"; the contents of each of which is incorporated herein by reference in its entirety for all purposes.

An example 200B of coupling die to such a substrate is shown at FIG. 2B, which shows a substrate 201b comprising a temporary carrier 205b and an interposer 210. As discussed herein, the temporary carrier 205b may, for example, comprise bulk silicon (e.g., a wafer, a panel, etc.), and the interposer 210 may comprise one or more dielectric layers (e.g., organic dielectric layers and/or inorganic dielectric layers) and one or more conductive layers that distribute (or redistribute, for example laterally) electrical signals to and/ or from electronic devices coupled thereto. The example interposer 210 shown in FIG. 2B, for example, comprises a native (or factory-formed) dielectric or passivation layer (e.g., oxide, nitride, etc.) on the silicon temporary carrier 205b. The example interposer 210, for example, also comprises a plurality of dielectric layers 213 and 216, and conductive layers (e.g., pads, lands, traces, under bump metallization layers, etc.) 212, 214, 215, and 217. In an example implementation, the interposer 210 may be formed on the temporary carrier 205b in a semiconductor wafer fabrication process (e.g., a Back End Of Line (or BEOL) process, etc.). In another example implementation, the interposer 210 (or one or more layers thereof) may be formed in a post-fab packaging process.

The example 200B also shows a first semiconductor die 225b1 comprising die interconnection structures 219 (e.g. conductive bumps, metal pillars or posts, etc.) permanently attached to pads 217 of the interposer 210. The second semiconductor die 225b2 is similarly connected to the interposer 210. Note that the interposer 210 may be formed to accommodate both the first semiconductor die 225b1 and the second semiconductor die 225b2 together in a completed electronic device, or the interposer 210 may be segmented into respective portions, each corresponding to a respective one of the semiconductor die 225b1 and 225b2.

Block 110 may comprise attaching (or mounting) the semiconductor die (and/or other electronic components) to the substrate utilizing any of a variety of types of interconnection structures (e.g., conductive balls or bumps, solder balls or bumps, metal posts or pillars, copper posts or pillars, solder-capped posts or pillars, solder paste, conductive adhesive, etc.). Block 110 may comprise mounting the electronic component(s) to the substrate utilizing any of a variety of bonding techniques (e.g., thermocompression bonding, mass reflow, laser reflow, adhesive attachment, etc.). In an example implementation, block 110 may comprise utilizing conductive bumps to electrically connect die bond pads of the semiconductor die to respective substrate bond pads of the substrate (e.g., an interposer thereof, etc.). Such die bond pads may, for example, be exposed through respective openings (or apertures) in a dielectric layer (or passivation layer) on the semiconductor die.

Though not shown, in various example implementations, block 110 may also, for example, comprise forming an underfill between the mounted semiconductor die(s) and the substrate (e.g., an interposer thereof, etc.). The underfill may comprise any of a variety of types of material, for example, an epoxy, a thermoplastic material, a thermally curable material, polyimide, polyurethane, a polymeric material, filled epoxy, a filled thermoplastic material, a filled thermally curable material, filled polyimide, filled polyurethane, a filled polymeric material, a fluxing underfill, and equivalents thereof, but not limited thereto. The underfill may be formed in any of a variety of manners (e.g., capillary underfilling, pre-applied underfilling of a liquid or paste or preformed sheet, molded underfilling, etc.). Such underfill may comprise any of a variety of characteristics (e.g., capillary underfill, pre-applied underfill, molded underfill, etc.). Note that in various alternative example implementations, such underfill is not formed at block 110 (e.g., never formed, formed at a later process step (e.g., at block 120), etc.).

Note that although the example implementations illustrated herein generally concern the coupling of semiconductor die to the substrate, the scope of this disclosure is not limited thereto. For example, any of a variety of different types of electronic components (e.g., semiconductor dies, passive components (e.g., resistors, capacitors, inductors, etc.), diodes, etc.) and/or any combination thereof may be coupled at block 110 or any other block.

In general, block 110 comprises coupling one or more electronic components (e.g., semiconductor die, etc.) to a substrate, for example comprising a temporary carrier. Accordingly, the scope of the present disclosure should not be limited by characteristics of any particular type of substrate (e.g., comprising a temporary carrier, etc.) or of any particular manner of coupling an electronic component to a substrate.

The example method 100 may, at block 120, comprise forming a first encapsulating material. Block 120 may comprise forming the first encapsulating material in any of a variety of manners, non-limiting examples of which are provided herein.

For example, block 120 may comprise forming the first encapsulating material utilizing compression molding, transfer molding, liquid encapsulant molding, vacuum lamination, paste printing, film assisted molding, etc. Also for example, block 120 may comprise forming the first encapsulating material utilizing spin coating, spray coating, printing, sintering, thermal oxidation, physical vapor deposition (PVD), chemical vapor deposition (CVD), metal organic chemical vapor deposition (MOCVD), atomic layer deposition (ALD), low pressure chemical vapor deposition (LPCVD), plasma enhanced chemical vapor deposition (PECVD), plasma vapor deposition (PVD), sheet lamination, evaporating, etc.

The first encapsulating material may comprise any of a variety of encapsulating or molding materials (e.g., epoxy mold compound (EMC), resin, polymer, polymer composite material, polymer with filler, epoxy resin, epoxy resin with filler, epoxy acrylate with filler, silicone resin, combinations thereof, equivalents thereof, etc.). The first encapsulating material may comprise any of a variety of characteristics. For example, the first encapsulating material may be characterized by a first modulus, a first coefficient of thermal expansion (CTE), a first maximum filler cut size, a first filler content or proportion, etc.

The first encapsulating material may, for example, cover lateral side surfaces (e.g., entirely cover or partially cover) of the semiconductor die (or other components) coupled to the substrate at block 110 and at least a first (or top) surface of the substrate. In an example implementation, the first encapsulating material may only cover the substrate at the first (or top) side.

The first encapsulating material may, for example, have a planar (or flat) top side or surface. The first encapsulating material may also, for example, comprise features (e.g., in the top side) into which another material formed later (e.g., at block 130, etc.) may extend. Such features may, for example, comprise apertures, grooves, through holes, divots, texture, asperities, etc. Block 120 may, for example, form such features during a molding process (e.g., utilizing projections from a mold or mold chase, etc.), after an initial forming process (e.g., by drilling, routing, cutting, etching, etc.), etc. Also note that block 120 may comprise forming the first encapsulating material by only partially curing the first encapsulating material, for example in preparation for a next process step (e.g., forming the second encapsulating material thereon at block 130).

Figures 3A, 3B:
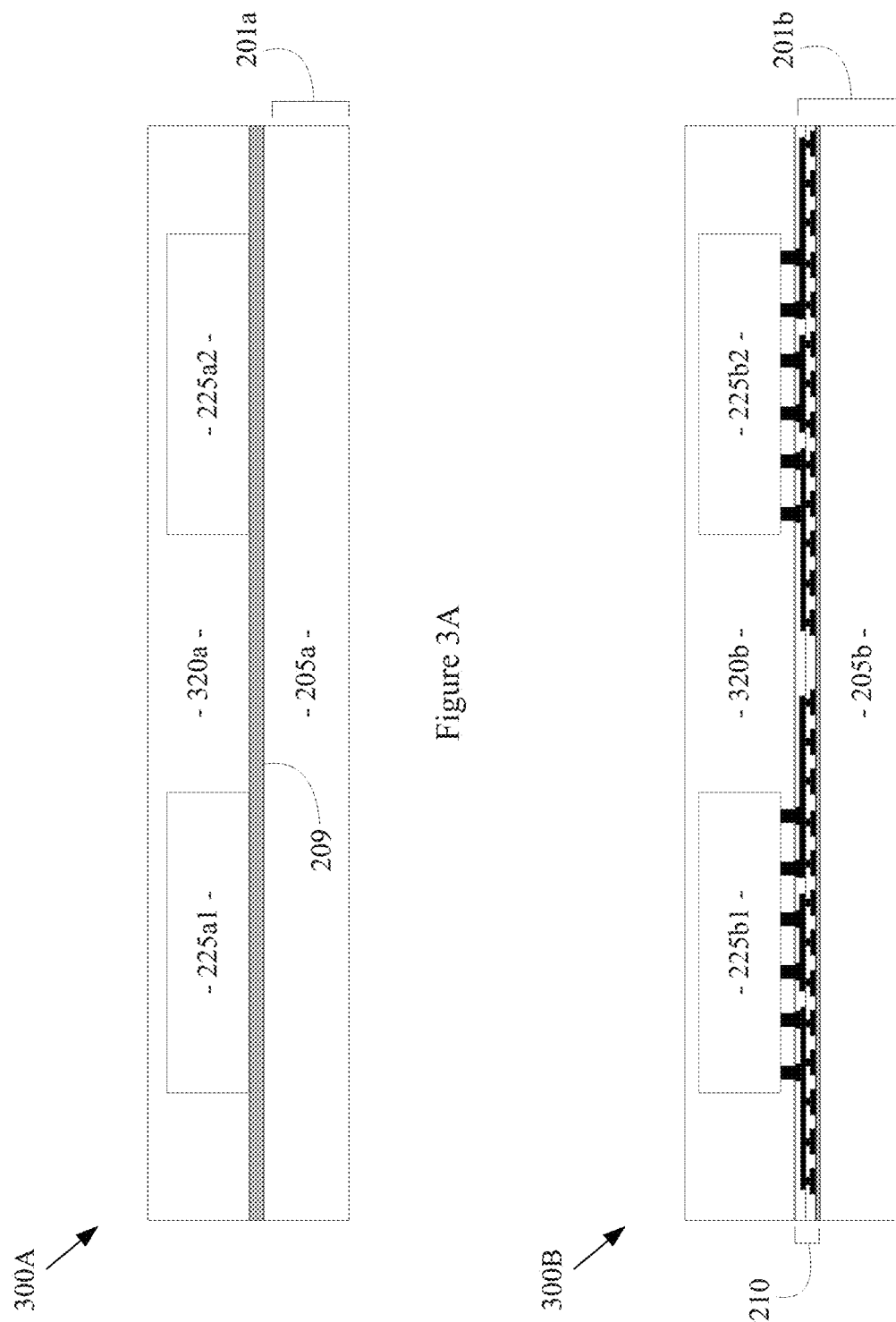
FIGS. 3A and 3B shown cross-sectional views illustrating an example electronic device and an example method of making an electronic device, in accordance with various aspects of the present disclosure.

Examples of forming the first encapsulating material are shown at FIGS. 3A and 3B. Relative to the example 200A of FIG. 2A, the example 300A of FIG. 3A shows the first encapsulating material 320a covering a first side (e.g., a top side) of the substrate 201a. In the example 300A, the first encapsulating material 320a directly contacts a first side (e.g., a top side) of the adhesive layer 209, but in another implementation the first encapsulating material 320a may directly contact a first side (e.g., a top side) of the substrate 201a. The example 300A also shows the first encapsulating material 320a contacting and covering a first side (e.g., a top side) of the semiconductor die 225a1 and 225a2. Note that in an alternative implementation, the first (or top) sides of such die 225a1 and 225a2 may be exposed from the first encapsulating material 320a. For example, a first (or top) side of the first encapsulating material 320a may be coplanar with first (or top) sides of the die 225a1 and 225a2. Also for example, the first (or top) sides of the die 225a1 and 225a2 may extend from the first encapsulating material 320a.

In the example 300A, the first encapsulating material 330a completely covers the lateral sides of the die 225a1 and 225a2, but as explained herein, the scope of this disclosure is not limited by the extent of such coverage. For example, such coverage may be full or partial.

Relative to the example 200B of FIG. 2B, the example 300B of FIG. 3B shows the first encapsulating material 320b covering a first side (e.g., a top side) of the substrate 201b. In the example 300B, the first encapsulating material 320b directly contacts a first side (e.g., a top side) of the interposer 210. The example 300B also shows the first encapsulating material 320b contacting and covering a first side (e.g., a top side) of the semiconductor die 225b1 and 225b2. Note that in an alternative implementation, the first (or top) sides of such die 225b1 and 225b2 may be exposed from the first encapsulating material 320b. For example, a first (or top) side of the first encapsulating material 320b may be coplanar with first (or top) sides of the die 225b1 and 225b2. Also for example, the first (or top) sides of the die 225b1 and 225b2 may extend from the first encapsulating material 320b.

In the example 300B, the first encapsulating material 330b completely covers the lateral sides of the die 225b1 and 225b2, but as explained herein, the scope of this disclosure is not limited by the extent of such coverage. For example, such coverage may be full or partial.

Note that blocks 110 and 120 may, for example, be referred to as forming a molded wafer or a reconstituted wafer.

In general, block 120 comprises forming a first encapsulating material. Accordingly, the scope of various aspects of this disclosure should not be limited by characteristics of any particular type of encapsulating material or of any particular manner of forming such encapsulating material.

The example method 100 may, at block 130, comprise forming a second encapsulating material. Block 130 may comprise forming the second encapsulating material in any of a variety of manners, non-limiting examples of which are provided herein.

For example, block 130 may comprise forming the second encapsulating material in any of the manners discussed herein with regard to block 120 and the forming of the first encapsulating material. For example, block 130 may comprise forming the second encapsulating material in a same manner as that in which the first encapsulating material was formed at block 120 or in a different manner.

The second encapsulating material may, for example, be different from the first encapsulating material. The second encapsulating material may comprise any of a variety of encapsulating or molding materials (e.g., epoxy mold compound (EMC), resin, polymer, polymer composite material, polymer with filler, epoxy resin, epoxy resin with filler, epoxy acrylate with filler, silicone resin, combinations thereof, equivalents thereof, etc.). The second encapsulating material may comprise any of a variety of characteristics.

For example, the second encapsulating material may be characterized by a second modulus, a second coefficient of thermal expansion (CTE), a second maximum filler cut size, a second filler content or proportion, etc. The second encapsulating material may comprise a lower quality and/or lower cost encapsulating material than the first encapsulating material formed at block 120. Since in various example implementations, all or substantially all of the second encapsulating material may be removed later (e.g., at block 160, etc.), so long as the second encapsulating material provides the desired support and stability during electronic device property, a relatively inexpensive material and/or process may be utilized. In other words, since most or all of the second encapsulating material will generally not be present in a completed electronic device, the quality requirements for such material may be relaxed.

In an example implementation, the second modulus of the second encapsulating material may be at least 25% higher than the first modulus of the first encapsulating material. In another example implementation, the second modulus of the second encapsulating material may be in the range from 25% higher to 50% higher than the first modulus of the first encapsulating material. In yet another example implementation, the second modulus of the second encapsulating material may be in the range from 10% higher to 75% higher than the first modulus of the first encapsulating material.

In an example implementation, the second maximum filler cut size of the second encapsulating material may be at least 25% higher than the first maximum filler cut size of the first encapsulating material. In another example implementation, the second maximum filler cut size of the second encapsulating material may be in the range from 25% higher to 50% higher than the first maximum filler cut size of the first encapsulating material. In yet another example implementation, the second maximum filler cut size of the second encapsulating material may be in the range from 10% higher to 75% higher than the first maximum filler cut size of the first encapsulating material. The second filler content (or proportion) may, for example, be similarly different from the first filler content (or proportion).

The second encapsulating material may, for example, cover at least a first (or top) surface of the first encapsulating material. In an example implementation, the second encapsulating material may only cover the first encapsulating material at the first (or top) side.

As discussed herein, the first encapsulating material formed at block 120 may, for example, have a planar (or flat) top surface. In such an example implementation, the second encapsulating material may have a planar (or flat) bottom surface that contacts (and interfaces directly with) the planar top surface of the first encapsulating material. Also as discussed herein, the top side of the first encapsulating material may, for example, comprise features (e.g., apertures, grooves, through holes, divots, texture, etc.) into which another material may extend. In such an example implementation, the second encapsulating material may have a bottom side that contacts the top side of the first encapsulating material and extends into such features, and a top side that may be generally planar.

As discussed herein, block 130 may comprise forming the second encapsulating material in a manner different from that in which the first encapsulating material was formed at block 120. In an example implementation, block 120 may comprise molding the first encapsulating material in a first molding process, and block 130 may comprise molding the second encapsulating material in a second molding process. Note that such molding processes may be performed using a same molding apparatus or a different molding apparatus. Such molding processes may also, for example, be different types of molding processes. In an example implementation, block 120 may comprise molding the first encapsulating material utilizing a liquid raw molding material, and block 130 may comprise molding the second encapsulating material utilizing a powdered raw molding material.

Figure 4A:
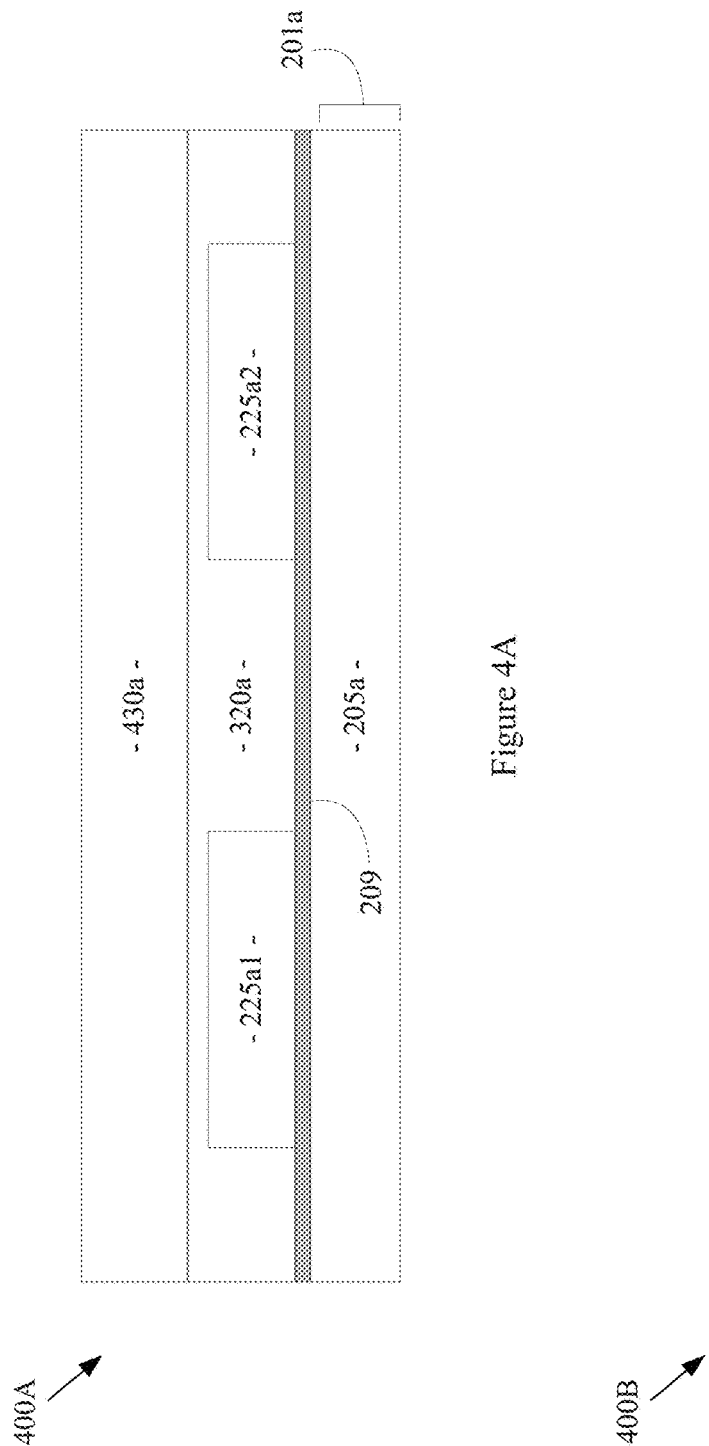
FIGS. 4A and 4B shown cross-sectional views illustrating an example electronic device and an example method of making an electronic device, in accordance with various aspects of the present disclosure.
Figure 4B:
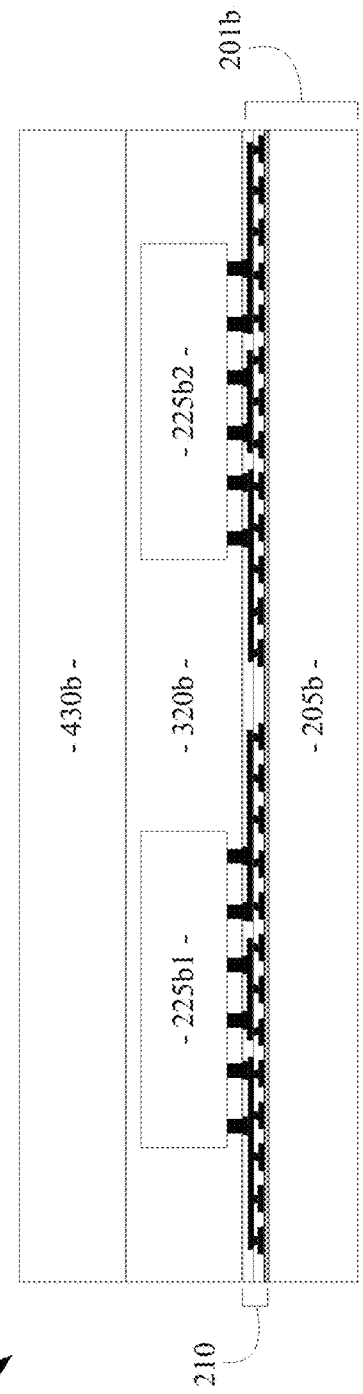

Examples of forming the second encapsulating material are shown at FIGS. 4A and 4B. Relative to the example 300A of FIG. 3A, the example 400A of FIG. 4A shows the second encapsulating material 430*a* covering a first side (e.g., a top side) of the first encapsulating material 320*a*. In the example 400A, the second encapsulating material 430*a* directly contacts a first side (e.g., a top side) of the first encapsulating material 320*a*, but in another implementation the second encapsulating material 430*a* may directly contact a first side (e.g., a top side) of an intervening layer (e.g., a releasable bonding agent, etc.), not shown, that is on the first encapsulating material 320*a*. The example 400A also shows the first encapsulating material 320*a* contacting and covering a first side (e.g., a top side) of the semiconductor die 225*a*1 and 225*a*2. Note that in an alternative implementation, the first (or top) sides of such die 225*a*1 and 225*a*2 may be exposed from the first encapsulating material 320*a*. For example, a first (or top) side of the first encapsulating material 320*a* may be coplanar with first (or top) sides of the die 225*a*1 and 225*a*2. In such an implementation, the second encapsulating material 430*a* may directly contact the first (or top) sides of the die 225*a*1 and 225*a*2. Also for example, the first (or top) sides of the die 225*a*1 and 225*a*2 may extend from the first encapsulating material 320*a*. In such an implementation, the second encapsulating material 430*a* may directly contact the first (or top) sides of the die 225*a*1 and 225*a*2 and may directly contact a top portion of the lateral sides of the die 225*a*1 and 225*a*2.

Relative to the example 300B of FIG. 3B, the example 400B of FIG. 4B shows the second encapsulating material 430*b* covering a first side (e.g., a top side) of the first encapsulating material 320a. In the example 400B, the second encapsulating material 430b directly contacts a first side (e.g., a top side) of the first encapsulating material 320b, but in another implementation the second encapsulating material 430b may directly contact a first side (e.g., a top side) of an intervening layer (e.g., a releasable bonding agent, etc.), not shown, that is on the first encapsulating material 320b. The example 400B also shows the first encapsulating material 320b contacting and covering a first side (e.g., a top side) of the semiconductor die 225b1 and 225b2. Note that in an alternative implementation, the first (or top) sides of such die 225b1 and 225b2 may be exposed from the first encapsulating material 320b. For example, a first (or top) side of the first encapsulating material 320b may be coplanar with first (or top) sides of the die 225b1 and 225b2. In such an implementation, the second encapsulating material 430b may directly contact the first (or top) sides of the die 225b1 and 225b2. Also for example, the first (or top) sides of the die 225b1 and 225b2 may extend from the first encapsulating material 320b. In such an implementation, the second encapsulating material 430b may directly contact the first (or top) sides of the die 225b1 and 225b2 and may directly contact a top portion of the lateral sides of the die 225b1 and 225b2.

In general, block 130 comprises forming a second encapsulating material. Accordingly, the scope of various aspects of this disclosure should not be limited by characteristics of any particular type of encapsulating material or of any particular manner of forming such encapsulating material.

The example method 100 may, at block 140, comprise removing the temporary carrier. Block 140 may comprise removing the temporary carrier in any of a variety of manners, non-limiting examples of which are provided herein.

For example, block 140 may comprise removing the temporary carrier of the substrate by sheering, peeling, pulling, cutting, etc. In an example implementation in which a thermally releasable adhesive was used at block 110 to attach the die, block 140 may comprise exposing the assembly to heat to release (or substantially weaken) the adhesive. Then a physical force may be applied to decouple the temporary carrier from the semiconductor dies and the first encapsulating material. If any adhesive remains on the semiconductor dies and/or the first encapsulating material after the decoupling of the temporary carrier, block 140 may comprise cleaning or stripping the remaining adhesive. Similarly, a light (or laser) releasable adhesive may similarly be utilized and exposed to laser (or other light) energy to release or weaken the adhesive. Also for example, block 140 may comprise removing the temporary carrier of the substrate by grinding, chemical/mechanical planarization (CMP), etching, etc.

In an example implementation in which the substrate comprises a temporary carrier and an interposer, block 140 may comprise grinding, utilizing CMP, or performing another thinning process to remove the temporary carrier from the interposer. For example, in an example implementation in which an interposer is integrally formed on a silicon (or semiconductor) carrier, for example utilizing a wafer fabrication process, block 140 may comprise removing the silicon carrier from the interposer by grinding the silicon, utilizing CMP, etc.

Figure 5A:
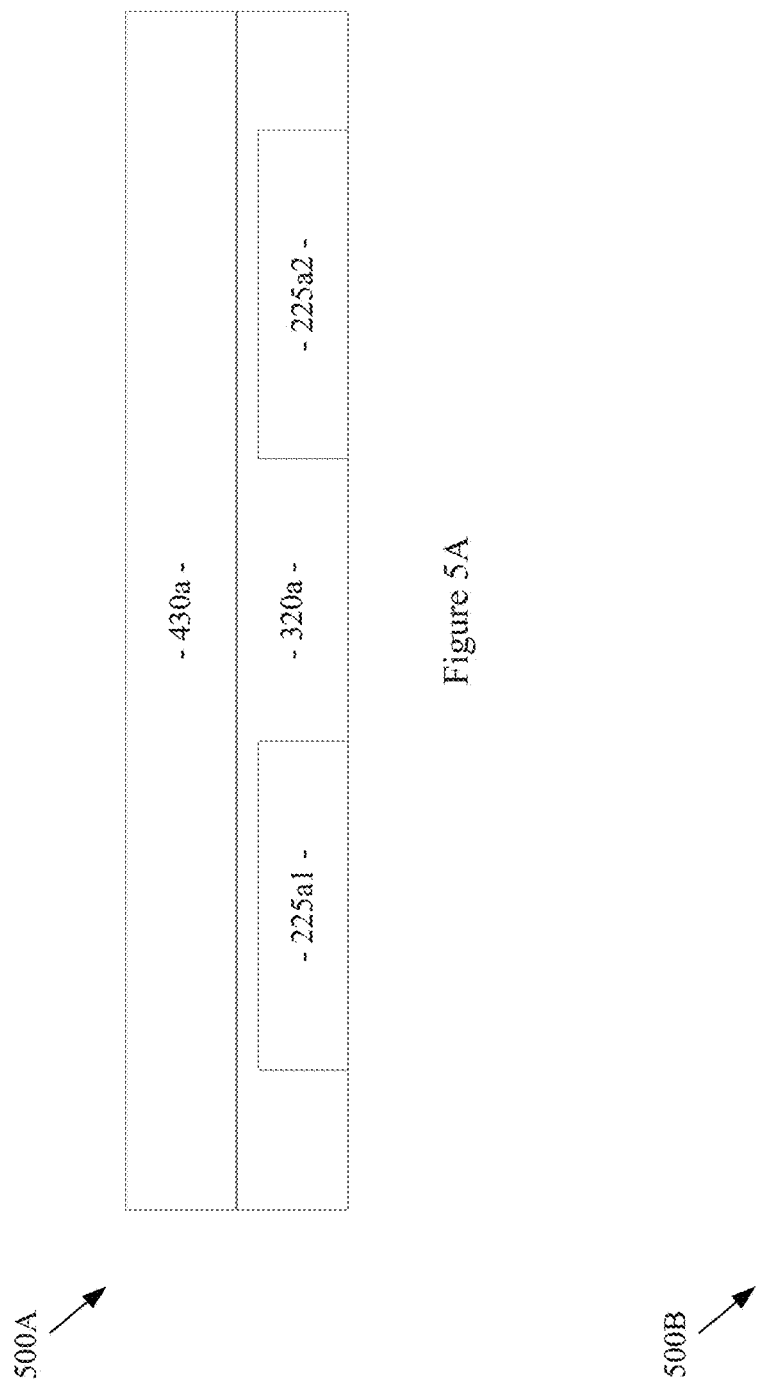
FIGS. 5A and 5B shown cross-sectional views illustrating an example electronic device and an example method of making an electronic device, in accordance with various aspects of the present disclosure.
Figure 5B:
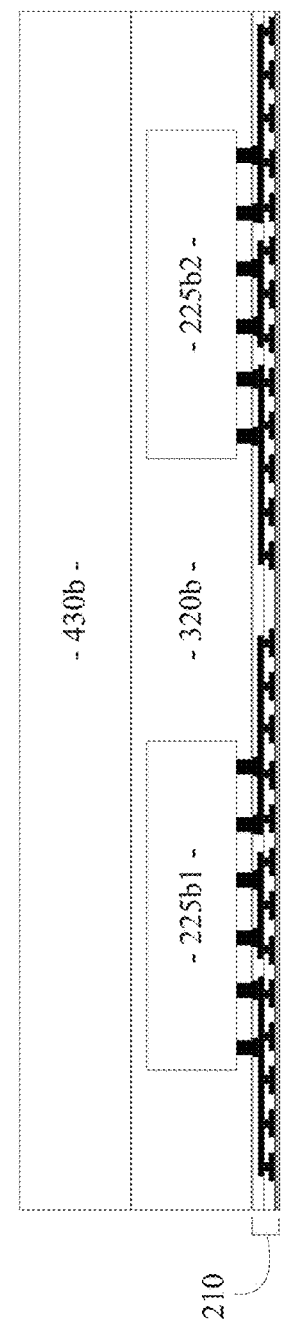

Examples of the removing the temporary carrier are shown at FIGS. 5A and 5B. Relative to the example 400A of FIG. 4A, the example 500A of FIG. 5A shows the temporary carrier 205a (of the substrate 201a) and adhesive layer 209 removed from the assembly (e.g., removed from the second (or bottom) sides of the semiconductor die 225a1 and 225a2, and removed from the second (or bottom) side of the first encapsulating material 320a). Note that such removal exposes the second (or bottom) sides of the semiconductor die 225a1 and 225a2 for further processing.

Relative to the example 400B of FIG. 4B, the example 500B of FIG. 5B shows the temporary carrier 205b of the substrate 201a removed from the assembly (e.g., removed from the second (or bottom) side of the interposer 210). Note that such removal exposes the second (or bottom) side of the interposer 210 for further processing. Also note that, as discussed herein, the remaining interposer 210 may have respective portions dedicated to each of the respective semiconductor die 225b1 and 225b2.

In general, block 140 comprises removing the temporary carrier. Accordingly, the scope of the present disclosure should not be limited by characteristics of any particular temporary carrier or of any particular manner of removing a temporary carrier.

The example method 100 may, at block 150, comprise further processing the electronic device. Block 150 may comprise further processing the electronic device in any of a variety of manners, non-limiting examples of which are provided herein.

For example, block 150 may comprise forming a signal redistribution structure on the second side (e.g., bottom side, active side, etc.) of the semiconductor die and on a second side (e.g., bottom side) of the first encapsulating material. In an example implementation, block 150 may comprise forming one or more dielectric layers and one or more conductive layers to laterally and/or vertically distribute electrical connections to and/or from the semiconductor die. Non-limiting examples of such signal redistribution structures and/or the forming thereof may, for example, be found in U.S. patent application Ser. No. 13/709,414, filed Dec. 10, 2012, titled "Method and System for Semiconductor Packaging", the entire content of which is hereby incorporated herein by reference for all purposes. Additional non-limiting examples of such signal redistribution structures and/or the forming thereof may, for example, be found in U.S. patent application Ser. No. 15/207,186, filed Jul. 11, 2016, and titled "Semiconductor Package and Fabricating Method thereof"; and U.S. patent application Ser. No. 14/823,689, filed Aug. 11, 2015, and titled "Semiconductor Package and Fabricating Method Thereof"; the content of each of which is incorporated herein by reference in its entirety for all purposes.

Block 150 may also, for example, comprise performing conductive interconnection structures. Such conductive interconnection structures may comprise any of a variety of different types of conductive interconnection structures (e.g., conductive balls or bumps, solder balls or bumps, metal posts or pillars, copper posts or pillars, solder-capped posts or pillars, solder paste, conductive adhesive, etc.), for example coupled to an interposer and/or signal redistribution structure. Such conductive interconnection structures may, for example, comprise package interconnection structures utilized for connecting the electronic device to another electronic device, to a multi-chip module substrate, to a motherboard, etc.

Block 150 may also, for example, comprise performing any of a variety of other electronic component manufacturing processes, for example, cleaning, marking, testing, etc.

In an example implementation, for example in which removal of the temporary carrier exposes a bottom side of the die and/or first encapsulating layer, block 150 may comprise forming a signal redistribution structure by, for example, forming a first dielectric layer (e.g., inorganic, organic, etc.) directly on the second (or bottom) side of the semiconductor dies and directly on a second (or bottom) side of the first encapsulating material; forming a conductive redistribution layer directly on the first dielectric layer; and forming a second dielectric layer directly on the conductive redistribution layer.

In another example implementation, for example in which removal of the temporary carrier exposes a bottom side of an interposer, block 150 may comprise forming the signal redistribution structure on a second side of the interposer opposite the first side of the interposer. For example, block 150 may comprise forming a first dielectric layer directly on the second side of the interposer, forming a conductive redistribution layer directly on the first dielectric layer, and forming a second dielectric layer directly on the conductive redistribution layer.

Examples of performing further processing of the electronic device are shown at FIGS. 6A and 6B. Relative to the example 500A of FIG. 5A, the example 600A of FIG. 6A shows an example multi-layer signal redistribution structure comprising a plurality of dielectric layers 668, 669, 671, 683, and 685, and a plurality of conductive layers and conductive vias 691, 692, 693, and 694. The conductive layer 691 may, for example, comprise an underbump metallization to which the conductive interconnection structure 699 is attached.

Relative to the example 500B of FIG. 5B, the example 600B of FIG. 6B shows an example multi-layer signal redistribution structure comprising a plurality of dielectric layers 671, 683, and 685, and a plurality of conductive layers and conductive vias 691 and 692 coupled to the second (or bottom) side of the interposer 210. The conductive layer 691 may, for example, comprise an underbump metallization to which the conductive interconnection structure 699 is attached.

Note that the signal distribution structures may comprise any number of dielectric and/or conductive layers.

In general, block 150 may comprise further processing the electronic device. Accordingly, the scope of the present disclosure should not be limited by characteristics of any particular type of further processing.

The example method 100 may, at block 160, comprise removing the second encapsulating material. Block 160 may comprise removing the second encapsulating material in any of a variety of manners, non-limiting examples of which are provided herein.

Block 160 may, for example, comprise removing the second encapsulating material by grinding the second encapsulating material, utilizing chemical/mechanical planarization, performing a general thinning operation, etc. For example, block 160 may comprise removing the entire second encapsulating material in a single grinding process or a multi-stage grinding process.

Also for example, block 160 may comprise removing at least a portion of the second encapsulating material and at least a portion of the first encapsulating material in a same grinding process or in multiple grinding processes.

In an example implementation, block 160 may comprise removing all of the second encapsulating material except a portion of the second encapsulating material that extends into features (e.g., apertures, grooves, through holes, divots, texture, etc.) in the first (or top) side of the first encapsulating material.

In another example implementation, block 160 may comprise removing all of the second encapsulating material, including a portion of the second encapsulating material that extends into features (e.g., apertures, grooves, through holes, divots, texture, etc.) in the first (or top) side of the first encapsulating material and a portion (or depth) of the first encapsulating material into which the second encapsulating material extends.

In still another example implementation, block 160 may comprise removing all of the second encapsulating material, a portion of the first (or top) side of the first encapsulating material, and/or a portion of the first (or top) side of the semiconductor dies.

Multiple stages (or levels) of grinding (or thinning) may be performed. For example, block 160 may comprise utilizing a fast and coarse grind to remove all or most of the second encapsulating material, and one or more slower and finer grinds to remove some of the first encapsulating material and/or some of the semiconductor dies.

Figure 7A:
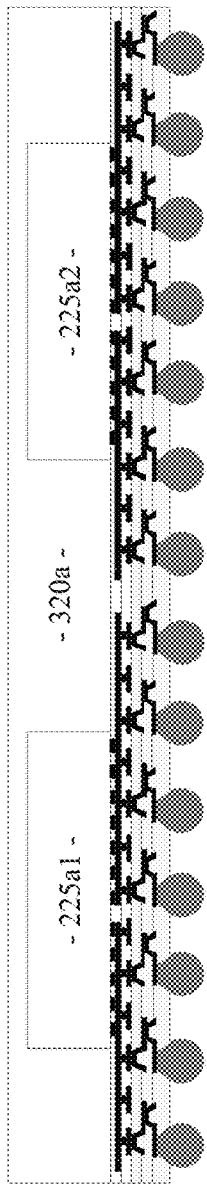
FIGS. 7A and 7B shown cross-sectional views illustrating an example electronic device and an example method of making an electronic device, in accordance with various aspects of the present disclosure.
Figure 7B:
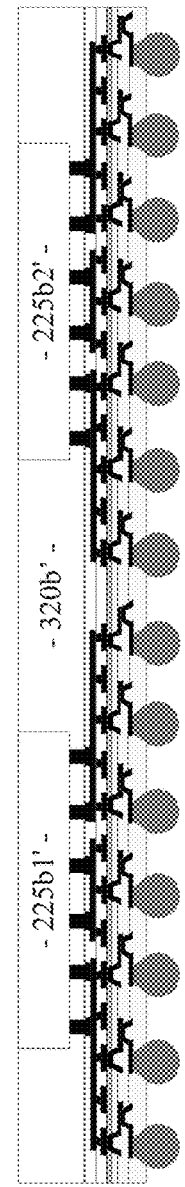

Examples of performing further processing of the electronic device are shown at FIGS. 7A and 7B. Relative to the example 600A of FIG. 6A, the example 700A of FIG. 7A shows the second encapsulating material 430*a* removed. In this example, the first encapsulating material 320*a* is left covering lateral sides and the top sides of the dies 225*a*1 and 225*a*2.

Relative to the example 600B of FIG. 6B, the example 700B of FIG. 7B shows the second encapsulating material 430*b* removed. In this example, a top portion of the first encapsulating material 320*b* has been removed, leaving the thinned first encapsulating material 320*b*'. Additionally, top portions of the semiconductor dies 225*b*1 and 225*b*2 have been thinned, leaving the thinned semiconductor dies 225*b*1' and 225*b*2'.

In general, block 160 comprises removing the second encapsulating material. Accordingly, the scope of the present disclosure should not be limited by any particular type of second encapsulating material, any particular amount of encapsulating material removed, or any particular manner of removing encapsulating material.

The example method 100 may, at block 170, comprise singulating the example electronic device from a wafer (or panel) thereof. Block 170 may comprise singulating (e.g., dicing, etc.) the example electronic device in any of a variety of manners, non-limiting examples of which are provided herein. For example, block 170 may comprise dicing a wafer (or panel) of the electronic devices by cutting (e.g., mechanical cutting, laser cutting, sawing, punching, etc.) along singulation (or saw) streets. Also for example, block 170 may comprise partially cutting along singulation (or saw) streets and breaking along a remaining portion of the streets (e.g., by stretching a compliant adhesive sheet to which the wafer (or panel) is attached.

After the singulating, the lateral sides of the layers through which the singulating is performed may be coplanar.

Note that in various example implementations that comprise multiple electrical components (e.g., semiconductor die, etc.) in an electronic device, block 170 may be skipped or may be performed around sets of multiple components of the electronic device.

Examples of singulating the electronic device(s) are shown at FIGS. 8A and 8B. Relative to the example 700A of FIG. 7A, the example 800A of FIG. 8A shows the dicing line 810*a* (or singulation street, or saw street, etc.) along which the singulating will be performed. Relative to the example 700B of FIG. 7B, the example 800B of FIG. 8B shows the dicing line 810*b* (or singulation street or saw street, etc.) along which the singulating will be performed.

In general, block 170 may comprise singulating the example electronic device. Accordingly, the scope of the present disclosure should not be limited by any particular manner of performing such singulating.

After block 170, execution of the example method 100 may flow to any of the other method blocks (or stages or steps) discussed herein, or portion thereof.

In summary, various aspects of this disclosure provide an electronic device and a method of making an electronic device. As non-limiting examples, various aspects of this disclosure provide methods of making an electronic device, and electronic devices made thereby, that comprise forming first and second encapsulating materials, followed by further processing, and the removal of the entire second encapsulating material. While the foregoing has been described with reference to certain aspects and examples, it will be understood by those skilled in the art that various changes may be made and equivalents may be substituted without departing from the scope of the disclosure. In addition, many modifications may be made to adapt a particular situation or material to the teachings of the disclosure without departing from its scope. Therefore, it is intended that the disclosure not be limited to the particular example(s) disclosed, but that the disclosure will include all examples falling within the scope of the appended claims.

What is claimed is:

1. An electronic device comprising:
   a substrate comprising an interposer comprising a first interposer side, and a second interposer side opposite the first interposer side;
   a semiconductor die comprising a first die side, a second die side opposite the first die side and coupled to the first interposer side, and lateral die sides extending between the first and second die sides;
   a first encapsulating material comprising a first encapsulant side facing away from the substrate and a second encapsulating side facing toward the substrate, where the first encapsulating material, laterally surrounds at least the entire lateral die sides, and covers at least the first interposer side;
   a second encapsulating material that covers at least the first encapsulant side of the first encapsulating material; and
   an interconnection structure on the second interposer side.

2. The electronic device of claim 1, wherein:
   the first encapsulating material comprises a cured liquid molding material; and
   the second encapsulating material comprises a cured powdered molding material.

3. The electronic device of claim 1, wherein the first encapsulating material has a first maximum filler size, and the second encapsulating material has a second maximum filler size that is at least 25% higher than the first maximum filler size.

4. The electronic device of claim 1, wherein:
   the first encapsulant side of the first encapsulating material comprises apertures;
   a portion of a second side of the second encapsulating material extends into the apertures of the first encapsulating material; and
   a first side of the second encapsulating material, opposite the second side of the second encapsulating material, is planar.

5. The electronic device of claim 1, wherein the second encapsulating material only contacts the first encapsulating material at the first encapsulant side of the first encapsulating material.

6. The electronic device of claim 1, wherein the interconnection structure comprises:
   a first dielectric layer directly on the second interposer side;
   a conductive redistribution layer directly on the first dielectric layer; and
   a second dielectric layer directly on the conductive redistribution layer.

7. The electronic device of claim 1, wherein the interconnection structure comprises:
   a first conductive ball on the second interposer side within a footprint of the semiconductor die; and
   a second conductive ball on the second interposer side outside the footprint of the semiconductor die.

8. The electronic device of claim 1, wherein the second encapsulating material comprises a grinded surface.

9. The electronic device of claim 1, wherein a portion of the first encapsulating material and a portion of the second encapsulating material are at a same height above the interposer.

10. An electronic device comprising:
    a plurality of semiconductor dies, wherein:
       each of the semiconductor dies comprises a first die side, a second die side opposite the first die side, and lateral die sides extending between the first and second die sides; and
       the second die sides of the semiconductor dies generally lie in a common plane;
    a first encapsulating material comprising a first encapsulant side facing a same direction as faced by the first die sides, and a second encapsulant side opposite the first encapsulant side, wherein:
       the first encapsulating material covers at least the lateral die sides of the semiconductor dies; and
       in a cross-sectional plane orthogonal to the common plane, the first encapsulating material is the only material, other than any die underfill material, that is positioned laterally directly between adjacent lateral die sides of the semiconductor dies;
    a second encapsulating material that covers at least the first encapsulant side of the first encapsulating material; and
    interconnection structures on each of the second die sides and on the second encapsulant side of the first encapsulating material.

11. The electronic device of claim 10, wherein the second encapsulating material comprises a grinded surface.

12. The electronic device of claim 10, wherein the second encapsulating material completely covers the first encapsulant side of the first encapsulating material.

13. The electronic device of claim 10, wherein:
    the first encapsulating material comprises a cured liquid molding material; and
    the second encapsulating material comprises a cured powdered molding material.

14. The electronic device of claim 10, comprising an underfill material, different from the first encapsulating material, that is positioned directly laterally between the semiconductor dies and directly vertically between the semiconductor dies and the interconnection structures.

15. The electronic device of claim 10, wherein the interconnection structures comprise:
    a first conductive ball on the second die side of the first die and electrically coupled to the first die; and
    a second conductive ball on the second side of the first encapsulating material outside a footprint of the first die, and electrically coupled to the first die.

16. The electronic device of claim 10, wherein the interconnection structures comprise:

a first dielectric layer on the second die side of the first die and on the second encapsulant side of the first encapsulating material;

a conductive redistribution layer directly on the first dielectric layer; and a second dielectric layer directly on the conductive redistribution layer.

17. An electronic device comprising:

a semiconductor die comprising a first die side, a second die side opposite the first die side, and a plurality of lateral die sides extending between the first and second die sides;

a first encapsulating material comprising a first encapsulant side that faces the same direction that the first die side faces, and a second encapsulant side opposite the first encapsulant side, wherein:

the first encapsulating material comprises a first mold material that covers at least the lateral die sides; and the semiconductor die does not protrude from the second encapsulant side of the first encapsulating material;

a second encapsulating material on the first encapsulating material, wherein:

the second encapsulating material comprises a second mold material; and within a footprint of the electronic device, the second encapsulating material covers only the first encapsulant side of the first encapsulating material; and one or more interconnection structures on each of the second die side and the second encapsulant side of the first encapsulating material.

18. The electronic device of claim 17, wherein:

the second encapsulant side of the first encapsulating material comprises a lowest surface of the first encapsulating material; and the lowest surface of the first encapsulating material is entirely planar.

19. The electronic device of claim 17, wherein the second encapsulating material comprises a grinded surface.

20. The electronic device of claim 17, wherein the one or more interconnection structures comprise conductive traces, and conductive balls attached to the conductive traces.

* * * * *